United States Patent [19]

Honma et al.

[11] Patent Number: 5,412,662
[45] Date of Patent: May 2, 1995

[54] MEMORY TESTING DEVICE FOR PREVENTING EXCESSIVE WRITE AND ERASURE

[75] Inventors: Tatsuya Honma; Tatsuo Kinugasa; Minoru Imai, all of Gyoda, Japan

[73] Assignee: Advantest Corporation, Tokyo, Japan

[21] Appl. No.: 143,054

[22] Filed: Oct. 29, 1993

[30] Foreign Application Priority Data

Oct. 30, 1992 [JP] Japan ................................ 4-292638

[51] Int. Cl.⁶ .............................................. G11C 29/00
[52] U.S. Cl. ................................................. 371/21.1
[58] Field of Search ..................... 371/21.1, 21.2, 22.1, 371/24, 25.1, 27, 20.4, 67.1, 71; 365/201

[56] References Cited

U.S. PATENT DOCUMENTS 4,628,509 12/1986 Kawaguchi ........................... 371/21
4,696,004 9/1987 Nakajima et al. ..................... 371/25
4,775,977 10/1988 Dehara .................................. 371/27
5,099,480 3/1992 Murata ............................... 371/20.4

Primary Examiner—Hoa T. Nguyen
Attorney, Agent, or Firm—Staas & Halsey

[57] ABSTRACT

A memory testing device having n test channels for simultaneously testing n memories. A pattern generator generates a sequence of test patterns each including a write enable signal, expected value data, write data and an address signal. In each test channel, the write enable signal WE is repeatedly applied via the AND gate to a terminal WE of the corresponding memory under test to write the data thereinto at an address designated by the address signal. Data read out therefrom is compared to the expected value data to produce a comparison result. The comparison result is used to control the AND gate so that when the comparison result indicates coincidence between the compared data, the write enable signal WE is inhibited.

6 Claims, 5 Drawing Sheets

MEMORY TESTING DEVICE FOR PREVENTING EXCESSIVE WRITE AND ERASURE

BACKGROUND OF THE INVENTION

The present invention relates to a memory testing device and, more particularly, to a memory testing device which prevents of an excessive write and an excessive erasure that accompany simultaneous testing of a plurality of flush Electrically Erasable Programmable ROMs (EEPROMs).

Memory testing equipment is usually required to test simultaneously a plurality of memories (hereinafter referred to as DUTs) through a plurality of channels. To meet this requirement, the memory testing device usually has such a construction as depicted in FIG. 1. A pattern generation part 10 generates, in synchronization with a clock CK from a timing generator 9, a test pattern TP which is composed of a sequence of each of an expected value pattern EV, a write enable signal WE, a data pattern Di ($=D_{i1}$ to $D_{im}$) of m ($m \geq 1$) bits and an address pattern A of plural bits. A signal generation part 20 is supplied with the write enable signal WE, the data pattern Di and the address pattern A and outputs them as waveform-shaped signals each having timing specified by a timing signal TS from the timing generator 9 and a predetermined level. These output signals (identified by the same reference characters as those of the input signals WE, Di and A, respectively) are each distributed by a signal distribution part 31 to n (n=1) channels and provided to corresponding pins of DUT1, DUT2, ... in common to them, wherein data is written into or read out from a memory cell specified by the address A. The data thus read out of the DUT in each test channel is input into a logical comparator 3C of a logical comparison part 32, wherein it is compared with the expectation pattern EV from the pattern generator 10 at the timing of a strobe signal STR from the timing generator 9. The result of the comparison is output as a pass/fail signal S, which is applied to the pattern generator 10 as well as to control the test pattern generation sequence.

When the DUT is an ordinary memory, data of a logic "1" (H level) is written thereinto once and then read out therefrom for comparison with an expectation. In the case of the thus written logic "1" data, data of a logic "0" (L level) is once written into the memory cell concerned to erase the previous data and then the newly written data is read out of the cell and compared with an expectation.

When the DUT is a flush EEPROM, however, a single write operation (or erase operation) is usually insufficient for effecting a write or erase and such an operation needs to be performed several times. The required number of write/erase cycles to complete a write (or erase) of data varies from DUT to DUT. For example, in the case of testing 100 memories at the same time, a combination write-read operation (hereinafter referred to as a W-R operation) is carried out for cells of the common address A, for instance, 20 times. In this instance, specimens for which the W-R operation had been needed 1 to 9 times before the decision signal Si becomes "PASS (OK)" are regarded as defective, and hence are rejected; specimens for which the W-R operation was needed 10 to 20 times are regarded as good, and hence are accepted; and specimens for which the decision signal Si does not become "PASS" or still remains "FAIL" after the W-R operation was performed 20 times are regarded as defective. Then each logical comparator 3C is cleared to zero by a clear signal CL from the pattern generator 10 and the same test as mentioned above is made for memory cells of the next address A+1. When the decision signal Si becomes "PASS" for all the DUTs before the W-R operation is performed 20 times, however, the address is advanced by 1 (i.e., +1) at that point, followed by the test for the cells of the new address. Such an operation is carried out by controlling the test pattern generation sequence in the pattern generator 10 on the basis of the decision signal S available from the logical comparator 3C of each channel. Although data input terminals and data output terminals of the DUT are shown to be independent of each other, they are provided as common terminals in many cases.

Since the conventional memory testing equipment is designed so that the same signal is applied, under the same condition, to a plurality of DUTs that are tested concurrently, the write (or erase) operation takes place a maximum allowable number of times (in the prior art example, 20 times for an allowable range of 10 to 20 times within which DUTs are regarded as good, for example). This poses an "excessive write (or excessive erasure)" problem to a DUT for which a write (or erase) of data has been completed by, for instance, a 10-times repetition of the write (or erase) operation.

The "excessive write" or "excessive erasure"mentioned herein means that a memory cell is overcharged positive or negative by inputting thereinto the write enable signal WE and data of the logic "1" or "0" more than a required number of times. If data of the logic "1" is excessively written, then the number of write operations of "0" required to erase "1" increases accordingly.

SUMMARY OF THE INVENTION

It is therefore an object of the present invention to provide a memory testing device which is capable of preventing excessive write or excessive erasure during testing of flush EEPROMs.

The present invention relates to a memory testing device which comprises: test pattern generating means which sequentially generates test patterns at desired timing while controlling their sequence on the basis of the result of a "defective or nondefective" decision made for each write and read test cycle on a respective address of memories under test, the test pattern including a write enable signal, an expected value signal, write data and an address signal; n test channels provided to permit simultaneous testing of a maximum number n of memories placed under test; signal distributing means which distributes the write enable signal, the expected value signal, the write data and the address signal from the test pattern generating means to each of the n test channels, the write data being written into and read out of the memory under test in each test channel at a memory cell specified by the address signal; logical comparison and decision means which makes a logical comparison between the data read out of the memory under test in each test channel and the expected value signal and outputs a decision signal indicating coincidence or noncoincidence between them; and gate means which is supplied at one input with the write enable signal distributed thereto by the signal distributing means in each test channel and at the other input with the decision signal from the logical comparison and decision means and inhibits the application of the write enable signal to a write enable terminal of the memory under test in each test channel when the decision signal indicates the coincidence.

In another aspect, the present invention relates to a memory testing device which comprises: test pattern generating means which sequentially generates test patterns at desired timing while controlling their sequence on the basis of the result of a "defective or nondefective" decision made for each write and read test cycle on a respective address of memories under test, the test pattern including a write enable signal, an expected value signal, write data, and address signal and a chip select signal; n test channels provided to permit simultaneous testing of a maximum number n of memories placed under test; signal distributing means which distributes the write enable signal, the expected value signal, the write data, the address signal and the chip select signal from the test pattern generating means to each of the n test channels, the data being written into and read out of the memory under test in each test channel at a memory cell specified by the address signal; logical comparison and decision means which makes a logical comparison between the data read out of the memory under test in each test channel and the expected value signal and outputs a decision signal indicating coincidence or noncoincidence between them; and gate means which is supplied at one input with the chip select signal distributed by the signal distributing means in each test channel and at the other input with the decision signal from the logical comparison and decision means and inhibits the application of the chip select signal to a chip select terminal of the memory under test in each test channel when the decision signal indicates the coincidence.

DESCRIPTION OF THE PREFERRED EMBODIMENTS

Figure 1:
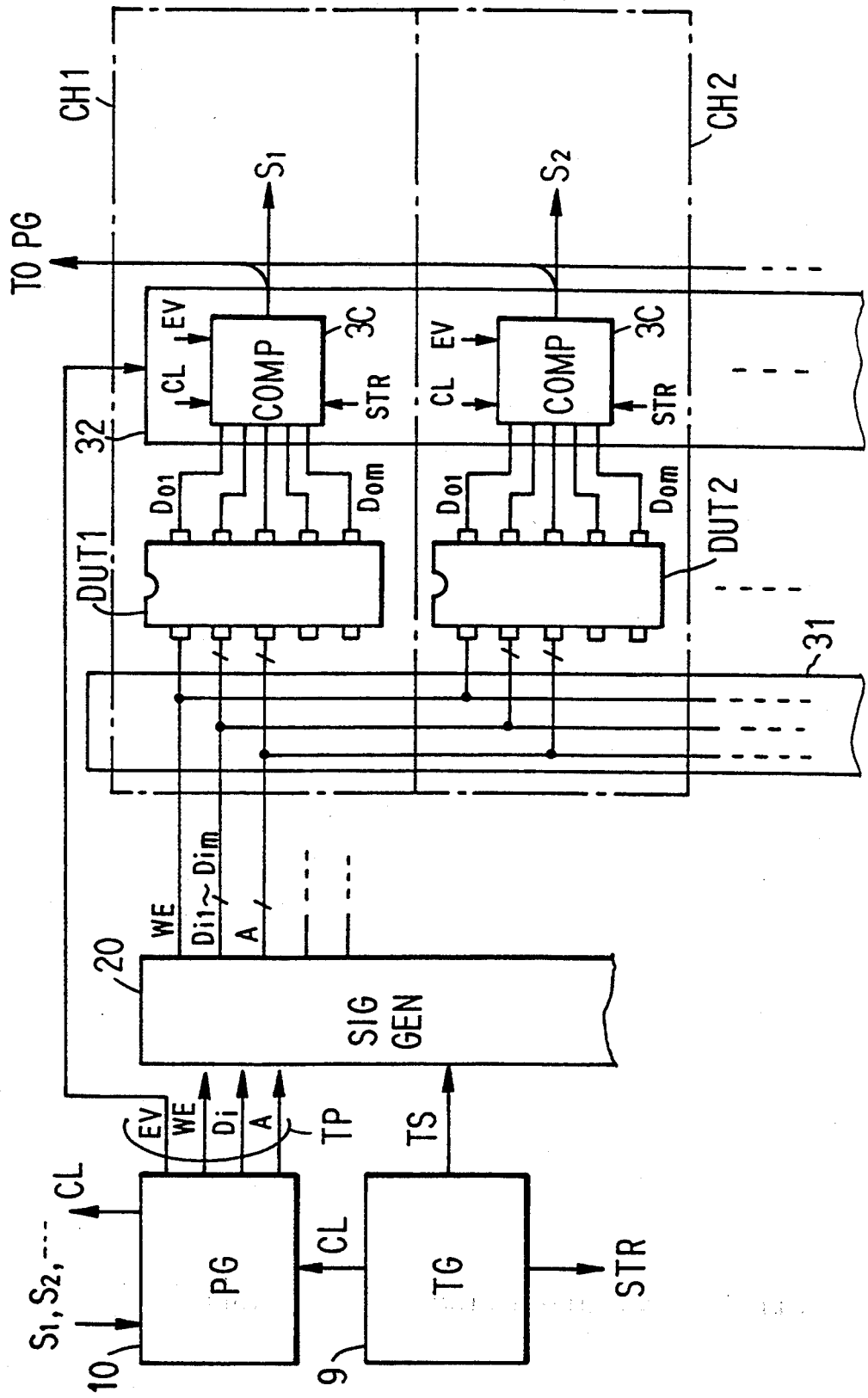
FIG. 1 is a block diagram of a conventional flush EEPROM testing device.
Figure 2:
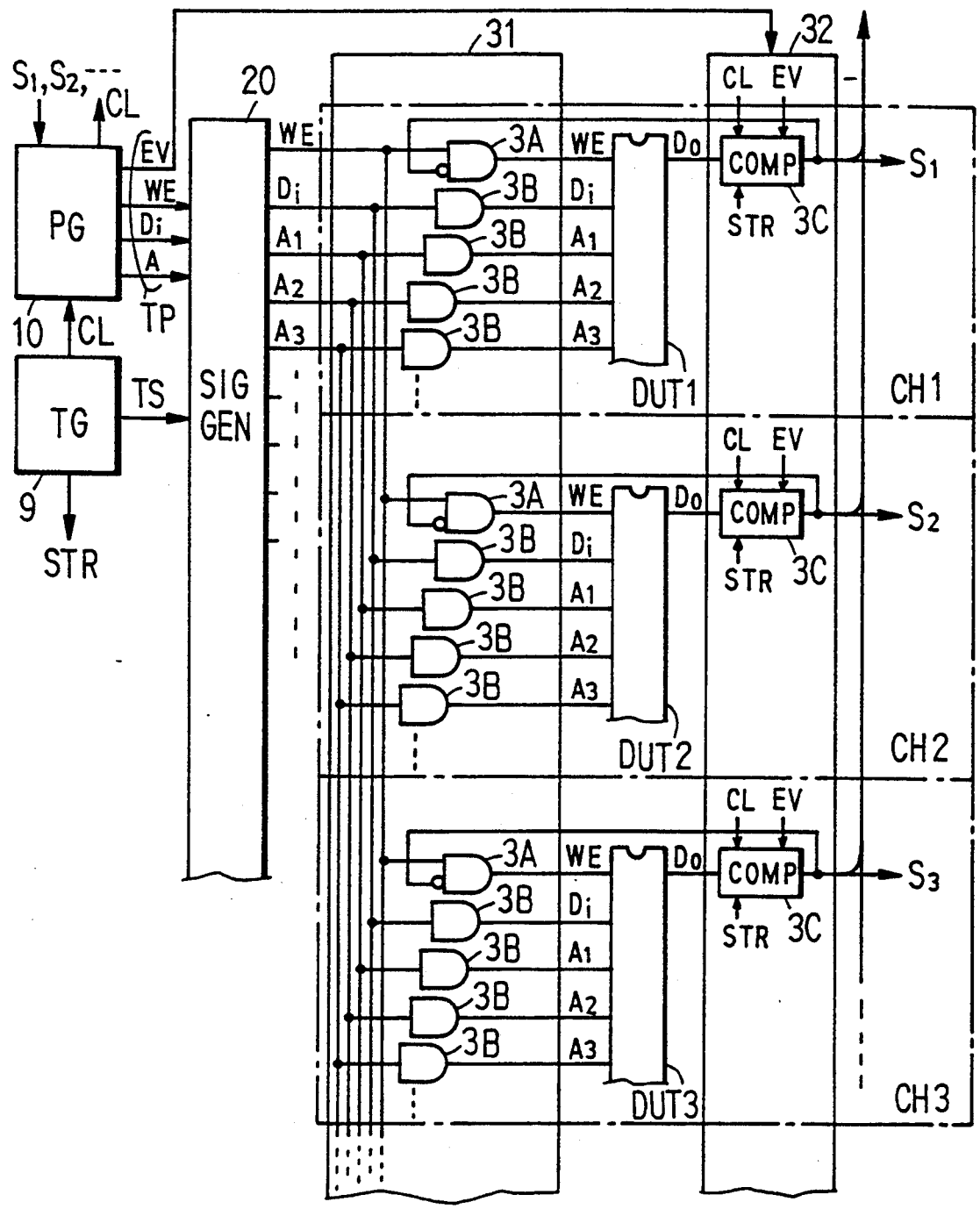
FIG. 2 is a block diagram illustrating a first embodiment of the present invention.

Referring now to FIG. 2, a first embodiment of the present invention will be described. In FIG. 2, input/output data of a DUT is m = 1 bit and the parts corresponding to those in FIG. 1 are identified by the same reference numerals. As is the case with FIG. 1, the signal generation part 20 generates the write enable signal WE, the data Di and the address A of h bits (=$A_1$, $A_2$, ... Ah) at predetermined levels and at predetermined timing on the basis of the test pattern from the pattern generator 10 and the timing signal TS from the timing generator 9. The write enable signal WE, the data Di and the address A thus produced by the signal generation part 20 are provided to the signal distribution part 31, which distributes them to n channels. In this embodiment, the write enable signal WE distributed to each of the channels CH1 through CHn is provided to one input of an AND gate 3A, whose output is applied to a write enable terminal WE of the DUT in the test channel. The data Di and the address A distributed to each test channel are provided via buffers 3B to a data terminal Di and address terminals $A_1$, $A_2$, ..., $A_n$ of the DUT, respectively. Data Do read out of the DUT is provided to the logical comparator 3C of the corresponding channel in the logical comparison part 32, wherein it is subjected to logical comparison with the expected value pattern EV from the pattern generator 10 at the timing of the strobe signal STR from the timing generator 9. The comparator 3C outputs a "1" or "0" as the decision signal S which indicates "PASS" or "FAIL" depending upon whether the result of comparison is "coincidence" or "noncoincidence". Each logical comparator 3C holds the result of decision S until the next strobe signal STR is applied, and it is cleared to zero by the clear signal CL which is generated when the address A is updated. The decision signal S immediately prior to the updating of the address A is applied to, for example, a display (not shown) in the corresponding test channel to provide a display "FAIL". The memory under test of the test channel thus indicated defective is handled as a defective at the end of the test. The output from the comparator 3C is applied to an inverting input terminal of the AND gate 3A, and consequently, when the result of comparison is "coincidence" (i.e. "PASS"), the gate 3A is disabled, inhibiting the passage therethrough of the write enable signal WE. The buffers 3B in the signal distribution part 31 may be omitted in some cases.

Figure 3:
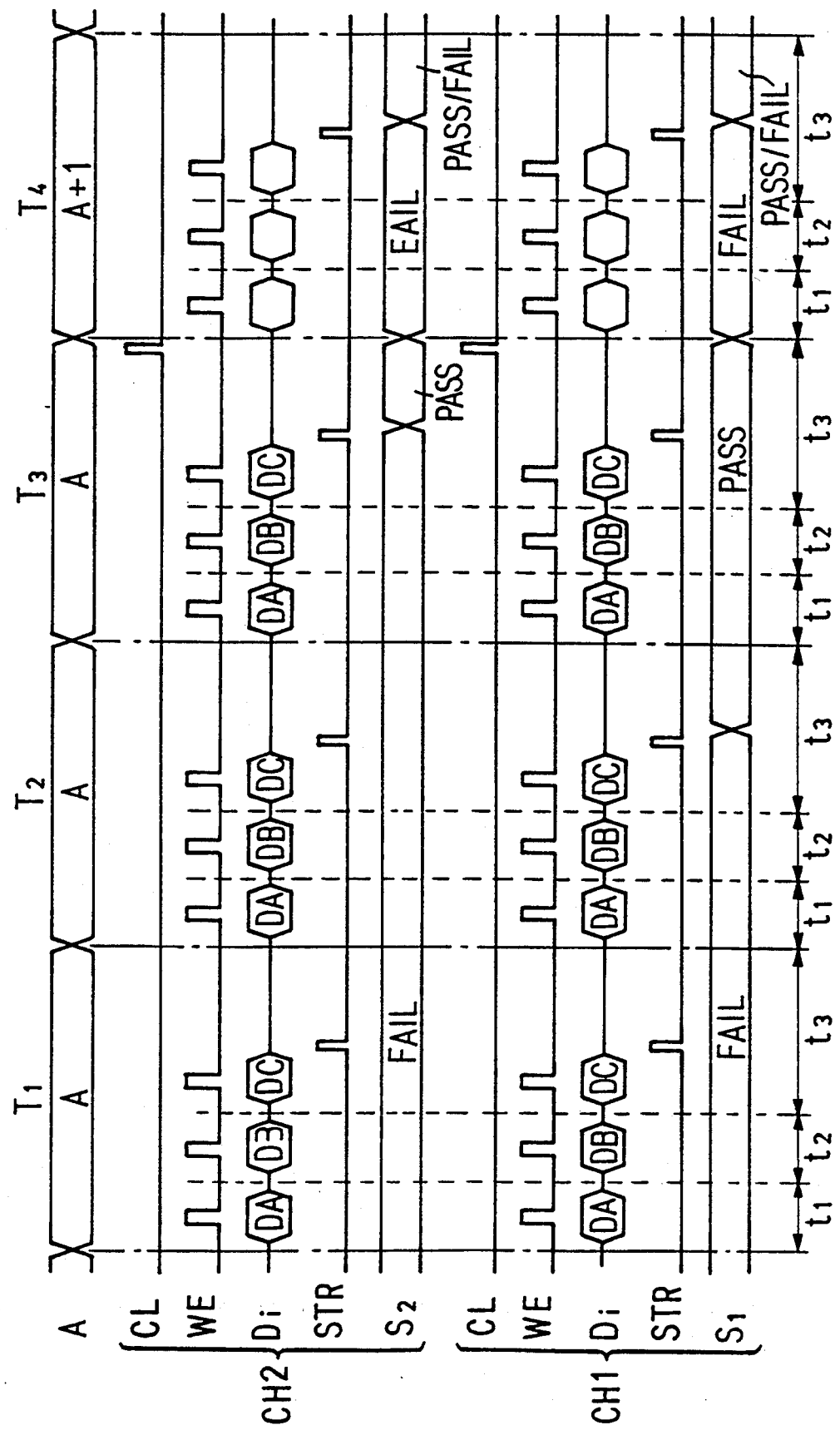
FIG. 3 timing chart of the operation of the FIG. 2 embodiment

FIG. 3 is a timing chart showing the operation of the FIG. 2 embodiment in the case where the number n of channels is 2, and hence two memories DUT1 and DUT2 are tested. In a test cycle $T_1$ the write enable signal WE from the signal generation part 20 is distributed by the signal distribution part 31 to the n channels. One input terminal of the AND gate 3A is connected to the output from the comparator 3C. The output from the comparator 3C, while cleared to zero, is at the low level, holding the AND gate 3A enabled. The output from the AND gate 3Z is provided to the write enable terminal WE of the corresponding DUT. The input data Di (one bit) and the address signal A of plural bits $A_1$, $A_2$, $A_3$, ... from the signal generation part 20 are distributed by the signal distribution part 31 to the n channels via the buffers 3B connected to the data input terminal and the address input terminals of the DUT, respectively.

In each test cycle $T_i$, a first period $t_1$ is used as a write mode setup period, in which data DA (which is not only at a reference voltage level of the logic L/H but also may sometimes be a particular voltage level) is fetched by the write enable signal WE into the DUT to place it in a write mode. The next period $t_2$ is a write period in which data DB is written by the signal WE into the DUT; that is, the data DB having a logic "1" or "0" is written into a memory cell of the address A. The next period $t_3$ is a readout period, in which data DC (which is not only of the logic L/H level but also a particular voltage level) is fetched by the signal WE into the DUT to place it in a readout mode and the data DB written into the DUT is read out therefrom.

The read-out data Do is input into the logical comparator 3C of the logical comparison part 32, which responds to the strobe signal STR to compare, at its timing, the data Do with the expected value EV to determine if the write (erase) is completed (that is, if the read-out data matches the expected value). The logical comparator 3C generates the decision signal (PASS/FAIL) signal S which is at the high or low level, depending on whether the write (erase) has been finished or not. The decision signal S is applied to the pattern generator 10 and the inverting input terminal of the AND gate 3A of the signal distribution part 31. The initial output of each logical comparator 3C is at the low level, and when supplied with the strobe signal STR, the logical comparator 3C outputs the result of comparison and holds it until application of the next strobe signal STR. In consequence, at the start of a series of test cycles $T_1, T_2, \ldots$, the output from the logical comparator 3C is at the low level, the gate; 3A being enabled.

Now, the operation of this embodiment will be described on the assumption that a write (erase) in the DUT is allowed to be effected two to five times. Fig. 3 shows the case where: in the first test cycle $T_1$, the DUT1 and the DUT2 are both decided as FAIL, the output from the respective logical comparator 3C remains unchanged and the pattern generator 10 is not advanced to a next address, that is, the test cycle is repeated using the same test pattern; in the second test cycle $T_2$, the DUT1 is decided as PASS and the DUT2 as FAIL; and in the third test cycle $T_3$, the DUT2 is decided as PASS. When the DUT1 is decided as PASS in the second test cycle $T_2$, a high-level signal is fed back to the inverting input terminal of the AND gate 3A, disabling it. Thereafter the output from the gate 3A always remains at the low level, inhibiting the application of the write enable signal WE to the DUT1 during the third test cycle $T_3$. This precludes the possibility of the data DB being written into the memory cell of the address A once more.

Since in the third test cycle $T_3$ the cells of the address A in both of the DUTs are decided as PASS, the pattern generator 10 clears the respective logical comparators 3C to zero by the clear signal CL at the end of the third test cycle $T_3$, making their outputs FAIL (i.e. low-level). At the start of the fourth test cycle $T_4$, the address in each test channel is advanced to A+1, followed by repeating the same write, read and decision operations as described above. In this example, since the DUT1 is decided as PASS in the second test cycle $T_2$ and the DUT2 in the third test cycle $T_3$, the numbers of write operations needed therefor are within the allowable range (two to five), and hence the DUTs are regarded as nondefective. If there is a DUT which still remains in FAIL mode even after the write operation has been performed five times, it will be decided as defective. This is displayed on a display (not shown) in the corresponding channel and the pattern generator 10 generates the clear signal CL to update the address A.

Figure 4:
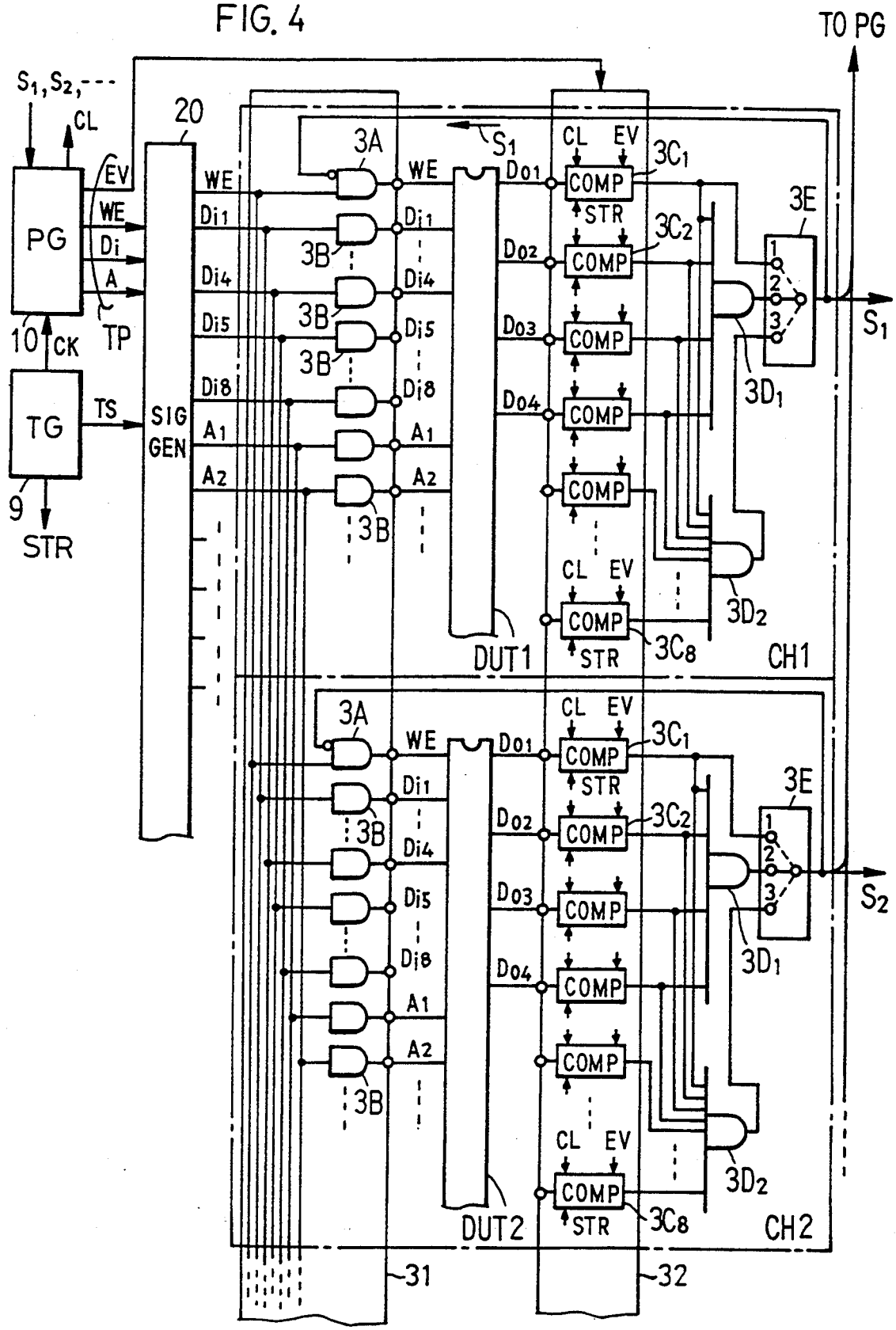
FIG. 4 is a block diagram illustrating a second embodiment of the present invention.

FIG. 4 illustrates another embodiment of the memory testing device according to the present invention which is designed to be able to test any DUT whose input/output data is 1, 4 and 8 bits, that is, memories of 1-bit, 4-bit and 8-bit words. Therefore, eight input/output terminals ($Di_1$ to $Di_8$ and $Do_1$ and $Do_8$) are provided for each channel, and eight logical comparators $3C_1$ to $3C_8$ are connected to the data input/output terminals in each channel. In the case of the 4-bit and 8-bit word memories, it is necessary that they be decided as good (PASS) only when their 4-bit and 8-bit read-out data completely match 4-bit and 8-bit expected values, respectively. To perform this, there are provided for each channel an AND circuit $3D_1$ for ANDing the outputs of the comparators $3C_1$ through $3C_4$, an AND circuit $3D_2$ for ANDing the outputs of the comparators $3C_1$ through $3C_8$, and a selector 3E which selects the output of any one of the logical comparator $3C_1$, the AND circuit $3D_1$ and the AND circuit $3D_2$ and outputs it as the decision signal S. The output from the selector 3E is also provided to the inverting input terminal of the corresponding AND gate 3A in the signal distribution part 31. By such a selection with the selector 3E, it is possible to test memories whose input/output data is 1-bit, 4-bit or 8-bit. In the FIG. 4 embodiment, the DUTs are memories each having a memory of the 4-bit word structure.

It is evident that the device of FIG. 4 can similarly be extended to 16-bit, 32-bit, ... structures. Alternatively, the device may also be fixed to any one of the 1-bit, 4-bit, 8-bit, ... structures. In such an instance, no selector is needed.

Figure 5:
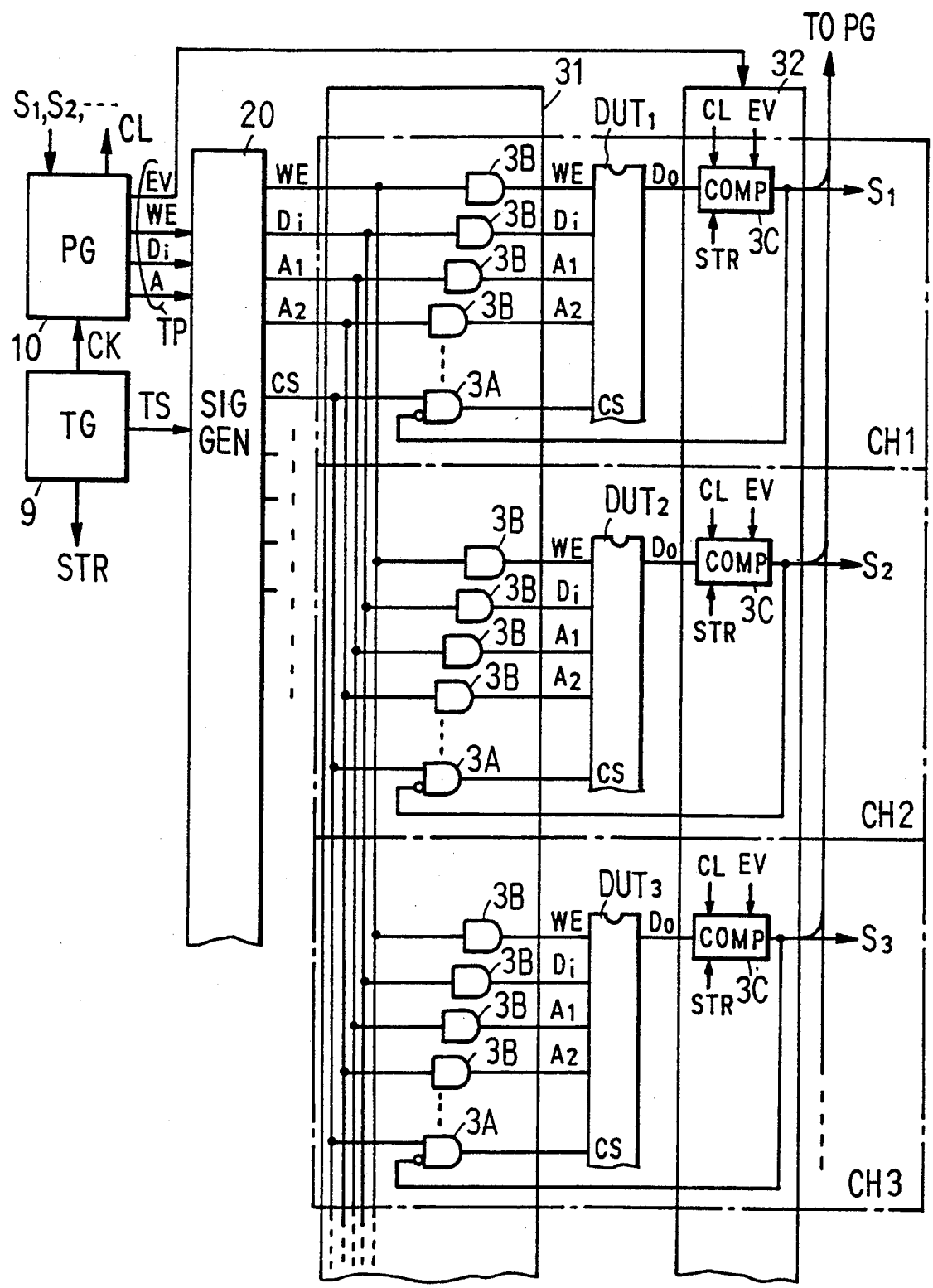
FIG. 5 is a block diagram illustrating a third embodiment of the present invention.

While the embodiments of FIGS. 2 and 4 have been described to be constructed so that an excessive write into the memory out under test DUT at the same address is inhibited by inhibiting the write enable signal WE through utilization of the result of logical comparison, the point is to inhibit further write in the memory at an address once the write therein has been completed. This could be implemented by a method different from that above-described. FIG. 5 illustrates still a further embodiment of the present invention for testing a 1-bit word memory by a method different from that used in the FIG. 1 embodiment. In general, a memory IC has a chip select terminal, though not shown in FIGS. 1, 2 and 4. The memory IC can be held active (ready for operation) only while the chip select terminal is retained high.

In the embodiment of FIG. 5, in each channel the write enable signal WE is applied to the write enable terminal WE of the DUT via the buffer 3B as is the case with the other signals Di and A. A chip select signal CS from the signal generation part 20 is applied via the AND gate 3A to a chip select terminal CS of the DUT. When the output S from the logical comparator 3C goes to "1," the gate 3A is disabled, inhibiting the passage therethrough of the chip select signal CS, and hence placing the memory DUT in the inoperative state. Thus, further write can be inhibited as in the case of FIG. 2. It is apparent that the construction for inhibiting the chip select signal CS on the basis of the result of comparison S is applicable to the FIG. 4 embodiment as well. In such a case, the output S from the selector 3E in FIG. 4 is used as the inhibit signal, of course.

As described above, according to the present invention, the operation of writing (or erasing) data D of logic "1" (or "0") is repeated for m memory cells of the address A in DUTs whose input/output data has an m-bit configuration and once the write is completed for the memory cell of any one of the DUTs, the signal S indicating the write is completed disables the corresponding AND gate 3A in the signal distribution circuit 31, thereafter inhibiting the application of the write enable signal WE or chip select signal CS to the DUT for which the write has been completed, until the write (or erase) operation for the n DUTs being simultaneously tested is carried out a predetermined number of times. Thus, a further write (or erase) of data at the same address, that is, an overwrite, is inhibited.

It will be apparent that many modifications and variations may be effected without departing from the scope of the novel concepts of the present invention.

What is claimed is:

1. A memory testing device having n memories under test and n-test channels for simultaneously testing n memories under test, n being an integer greater than or equal to one, comprising:

test pattern generating means for sequentially generating test patterns at desired timings while controlling the sequence of said test patterns, said test patterns each including a write enable signal, expected value data, write data and an address signal;

signal distributing means which distributes said test patterns to each of said n test channels, each of said n test channels providing said write enable signal, said write data and said address signal to corresponding ones of said n memories under test for writing thereinto said write data and reading out therefrom data at an address specified by said address signal;

n logical comparison and decision means each provided in a corresponding one of said n test channels for reading out and logically comparing said data read out of said corresponding one of said n memories under test and said expected value data from said distributing means and for outputting through said corresponding one of said n channels a decision signal indicating one of a coincidence and a noncoincidence between said data read out and said expected value data, said decision signal being supplied to said test pattern generating means to control the sequence of generating of said test patterns; and n gate means each provided in a corresponding one of said n test channels for receiving at its first and second inputs through said corresponding one of said n channels said write enable signal from said signal distributing means and said decision signal from said logical comparison and decision means and for inhibiting the application of said write enable signal to a write enable terminal of a corresponding one of said n memories under test when said decision signal indicates said coincidence.

2. The memory testing device of claim 1 wherein each of said expected value data, said write data and said read out data m-bit data and wherein said logical comparison and decision means in each of said n test channels includes m logical comparators for comparing a corresponding bit of the m-bit data read out of a corresponding one of said n-memories under test and a corresponding one of the m-bits of said expected value data and AND means for outputting, as said decision signal, the AND of the outputs from said m logical comparators, m being an integer greater than or equal to 2.

3. The memory testing device of claim 1 wherein each of said expected value data, said write data and said read out data is m-bit data and wherein said logical comparison and decision means in each of said n test channels includes m logical comparators each for comparing a corresponding one bit of the m-bit data read out of a corresponding one of said n memories under test and a corresponding one of the m bits of said expected value data, first AND means for ANDing the outputs of said logical comparators corresponding to first to fourth bits of the m-bit read-out data, second AND means for ANDing the outputs of said logical comparators corresponding to said first to eighth bits of said m-bit read-out data, and selecting means for selecting the output from at least one of said first and second AND means and for outputting it as said decision signal, m being an integer greater than or equal to 8.

4. A memory testing device having n test channels for simultaneously testing n memories under test each memory having a chip select terminal and being held operative while being supplied with a chip select signal at the chip select terminal, n being an integer greater than or equal to one, comprising:

test pattern generating means for sequentially generating test patterns at desired timings while controlling the sequence of the test patterns, said test patterns each including a write enable signal, expected value data, write data, an address signal and a chip select signal;

signal distributing means for distributing said test patterns to each of said n test channels, each of said n test channels providing said write enable signal, said write data, said address signal and said chip select signal to a corresponding one of said memories under test for writing thereinto said write data and reading out therefrom data at an address specified by said address signal;

n logical comparison and decision means each provided in a corresponding one of said n test channels for reading out end logically comparing said data read out of said corresponding one of said n memories under test and said expected value signal from said distributing means and for outputting through said corresponding one of said n channels a decision signal indicating one of coincidence and noncoincidence between said data read out and said expected value data, said decision signal being supplied to said test pattern generating means to control the sequence of generation of said test patterns; and n gate means each provided in a corresponding one of said n channels for receiving at first and second inputs through said corresponding one of said n channels said chip select signal from said signal distributing means and said decision signal from said logical comparison and decision means for inhibiting the application of said chip select signal to the write enable terminal of a corresponding one of said n memories under test when said decision signal indicates said coincidence.

5. The memory testing device of claim 4, wherein each of said expected value data, said write data and said read out data is m-bit data and wherein said logical comparison and decision means in each of said n test channels includes m logical comparators for comparing corresponding one bit of the m-bit data read out of corresponding one of said n memories under test and corresponding one of the m bits of said expected value data and AND means for outputting, as said decision signal, the AND of the outputs from said m logical comparators, m being an integer greater than or equal to 2.

6. The memory testing device of claim 4, wherein each of said expected value data, said write data and said read out data is m-bit data and wherein said logical comparison and decision means in each of said n test channels includes m logical comparators each for comparing a corresponding one bit of the m-bit data read out of a corresponding one of said n memories under test and a corresponding one of the m bits of said expected value data, first AND means for ANDing the outputs of said logical comparators corresponding to first to fourth bits of the m-bit read-out data, second AND means for ANDing the outputs of said logical comparators corresponding to said first to eighth bits of said m-bit read-out data, and selecting means for selecting the output from at least one of said first and second AND means and for outputting it as said decision signal, m being an integer greater than or equal to 8.

* * * * *

UNITED STATES PATENT AND TRADEMARK OFFICE
CERTIFICATE OF CORRECTION

PATENT NO. : 5,412,662
DATED : May 2, 1995
INVENTOR(S) : T. Honma et al

It is certified that error appears in the above-indentified patent and that said Letters Patent is hereby corrected as shown below:

Col. 1, line 30, change "(n = 1)" to --(n ≥ 1)--

Col. 2, line 28, after "erasure" insert a space

Col. 3, line 41, after "3" insert --is a-- line 42, after "embodiment" insert --;-- line 57, change "Ah" to --$A_h$--

Col. 4, line 55, change "of" to --having--

Col. 5, line 11, delete ";"

line 20, delete the space after "address"

line 47, after "in", insert --a--

UNITED STATES PATENT AND TRADEMARK OFFICE
CERTIFICATE OF CORRECTION

PATENT NO. : 5,412,662
DATED : May 2, 1995
INVENTOR(S) : T. Honma et al

It is certified that error appears in the above-indentified patent and that said Letters Patent is hereby corrected as shown below:

Col. 6, line 9, delete "memory of the"

line 18, change "out" to --OUT--; delete " DUT"

line 52, after "configuration" insert --.--; delete "and"

line 54, after "completed" insert --,--

Col. 7, line 40, after "data" insert --is--

Col. 8, line 19, change "end" to --and--

Signed and Sealed this

Eighth Day of August, 1995

Attest:

BRUCE LEHMAN

Attesting Officer      Commissioner of Patents and Trademarks